US008272880B2

(12) United States Patent
Tanaka (10) Patent No.: US 8,272,880 B2
(45) Date of Patent: Sep. 25, 2012

(54) SOCKET AND SEMICONDUCTOR DEVICE INCLUDING SOCKET AND SEMICONDUCTOR PACKAGE

(75) Inventor: Masato Tanaka, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 0 days.

(21) Appl. No.: 13/029,822

(22) Filed: Feb. 17, 2011

(65) Prior Publication Data

US 2011/0207346 A1    Aug. 25, 2011

(30) Foreign Application Priority Data

Feb. 19, 2010 (JP) ................. P2010-034886

(51) Int. Cl.
*H01R 12/00* (2006.01)

(52) U.S. Cl. ............................ 439/71; 439/73

(58) Field of Classification Search .............. 439/66, 439/71, 73, 74, 81, 83
See application file for complete search history.

(56) References Cited

U.S. PATENT DOCUMENTS

| 6,994,565 B2 * | 2/2006 | Harper, Jr. ......... 439/66 |
| 7,264,486 B2 | 9/2007 | Ma |
| 7,563,107 B2 * | 7/2009 | Liao et al. ......... 439/71 |

* cited by examiner

*Primary Examiner* — Ross Gushi
(74) *Attorney, Agent, or Firm* — Drinker Biddle & Reath LLP (57) ABSTRACT

A socket includes: a circuit board; a plurality of connection terminals disposed on the circuit board; a plurality of contacts each fixed to a corresponding one of the connection terminals, wherein each of the contacts is formed of a conductive elastic member, each of the contacts comprising: a tail portion fixed to the corresponding connection terminal; an extending portion connected to the tail portion and extending in a direction substantially parallel with a surface of the circuit board; a rise portion connected to the extending portion and extending in a direction substantially perpendicular to the surface of the circuit board; and a tip portion connected to the rise portion.

4 Claims, 8 Drawing Sheets

SOCKET AND SEMICONDUCTOR DEVICE INCLUDING SOCKET AND SEMICONDUCTOR PACKAGE

BACKGROUND

1. Technical Field

The present disclosure relates to a socket and a semiconductor device including the socket and a semiconductor package connected to the socket.

2. Related Art

Various techniques have been disclosed for sockets that are used for electrical connection between electronic components.

For example, a structure is known in which connection pads of an LGA (land grid array) semiconductor package are brought into pressure contact with contacts of a high-springiness socket in connecting the semiconductor package to a mounting circuit board via the socket (see e.g., U.S. Pat. No. 7,264,486).

However, in the structure for connecting an LGA semiconductor package to a mounting circuit board using a socket as disclosed in U.S. Pat. No. 7,264,486, for example, the thickness of the socket is generally larger than 4 mm. Furthermore, this structure is associated with a problem that it cannot be used for products that are strongly required to be reduced in thickness and weight because the structure needs a heavy reinforcement member such as a back plate.

A structure for connecting a semiconductor package to a mounting circuit board using a socket will be described below with reference to a semiconductor device 101 shown in FIG. 8, which uses a socket as disclosed in U.S. Pat. No. 7,264,486.

Figure 8:
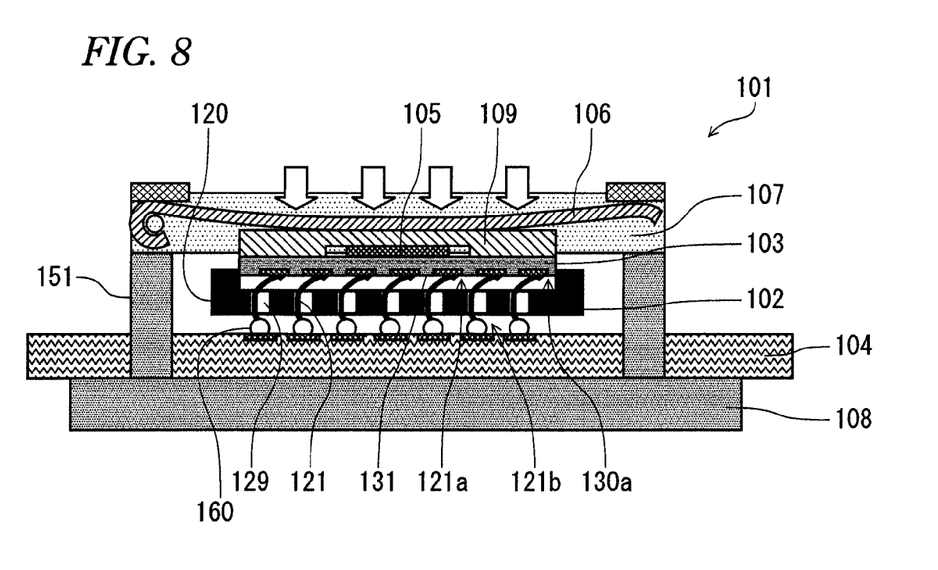
FIG. 8 is a schematic front sectional view showing the configuration of a related-art semiconductor device.

As shown in FIG. 8, the semiconductor device 101 has a structure that an LGA semiconductor package 103 in which a semiconductor chip 105 is mounted on its top surface and its bottom surface is formed with electrical conduction terminals (hereinafter referred to as pads) 131 is connected to a mother board 104 (mounting circuit board) via a socket 102.

In this connection structure, in the socket 102, metal contacts 121 are inserted in through-holes 129 of a housing 120, which are located at such positions as to face the respective pads of the LGA semiconductor package 103. The housing 120 is made of an insulative resin. Tip portions 121a of the contacts 121 are in contact with the respective pads 131 of the semiconductor package 103. On the other hand, rear end portions (base portions) 121b of the contacts 121 are fixed (joined) to the mounting circuit board 104 with solder balls 160.

To ensure the electrical connections, the LGA semiconductor package 103 is fixed to the socket 102 in a state that the former is pressed, by strong force, against (and into) the latter in the direction (indicated by arrows in FIG. 8) that is perpendicular to a pad formation surface 130a. The force is applied to the top surface of a heat spreader 109 which is provided on the semiconductor package 103.

For example, the semiconductor package 103 has outer dimensions of about 35 mm×35 mm or about 45 mm×45 mm and is provided with about 1,400 pads 131. Therefore, the socket 102 which is connected to the semiconductor package 103 is also provided with about 1400 contacts 121. Therefore, to bring each contact 121 into contact with the corresponding pad 131 with prescribed pressure, the semiconductor package 103 needs to be pressed against the socket 102 by strong force of about 20 to 30 kgf.

In the semiconductor device 101, the prescribed pressure that is necessary for the connection is obtained by pressing the semiconductor package 103 against the socket 102 by means of a pressing means (urging member) 106. However, the strong force that is applied to the socket 102 in the direction perpendicular to the pad formation surface 130a acts on the mounting circuit board 104 as it is. Therefore, to prevent a warp or breakage of the mounting circuit board 104, the bottom surface of the mounting circuit board 104 is provided with a back plate 108 which serves as a reinforcement member for receiving the force. The back plate 108 is fixed, via support members 151, to a frame body 107 in which the pressing means (urging member) 106 is provided. For example, the back plate 108 is made of an iron-based material, and is a heavy component that weighs up to 150 g.

In semiconductor devices in which a semiconductor package is connected to a mounting circuit board via a socket as described above, recent increase in the number of pins of a semiconductor chip requires reduction in the socket-side terminal pitch. However, in the above-described semiconductor device 101, it is difficult to reduce the socket-side terminal pitch while giving each contact 121 a sufficient operation area for good electrical contact because of restrictions relating to the design of the contacts 121 and insufficient strength of the housing 120.

In addition, to secure good electrical contact, strong force needs to be applied to the socket 102 in the direction perpendicular to the pad formation surface 130a. This necessitates a component (e.g., back plate 108) that is heavy and makes the structure complex. Such a component is an obstruction to reduction in thickness and weight of an electrical product incorporating the semiconductor device 101.

Furthermore, to increase the processing speed of the semiconductor device 101, the socket 102 is required to be reduced in thickness. However, it is difficult to satisfy this requirement because of the same reasons mentioned above, that is, restrictions relating to the design of the contacts 121 and insufficient strength of the housing 120.

SUMMARY OF THE INVENTION

Exemplary embodiments of the present invention address the above disadvantages and other disadvantages not described above. However, the present invention is not required to overcome the disadvantages described above, and thus, an exemplary embodiment of the present invention may not overcome any disadvantages described above.

According to one or more illustrative aspects of the present invention, there is provided a socket. The socket includes: a circuit board; a plurality of connection terminals disposed on the circuit board; a plurality of contacts each fixed to a corresponding one of the connection terminals, wherein each of the contacts is formed of a conductive elastic member. Each of the contacts includes: a tail portion fixed to the corresponding connection terminal; an extending portion connected to the tail portion and extending in a direction substantially parallel with a surface of the circuit board; a rise portion connected to the extending portion and extending in a direction substantially perpendicular to the surface of the circuit board; and a tip portion connected to the rise portion.

According to one or more illustrative aspects of the present invention, there is provided a semiconductor device including a socket and a semiconductor package. The socket includes: a circuit board; a plurality of connection terminals disposed on the circuit board; a plurality of contacts each fixed to a corresponding one of the connection terminals, wherein each of the contacts is formed of a conductive elastic member, each of the contacts including: a tail portion fixed to the corresponding connection terminal; a n extending portion connected to the tail portion and extending in a direction substantially parallel with a surface of the circuit board; a rise portion connected to the extending portion and extending in a direction substantially perpendicular to the surface of the circuit board; and a tip portion connected to the rise portion. The semiconductor package is electrically connected to the socket. The semiconductor package includes: a plurality of recesses each comprising a bottom surface and a side wall; and a plurality of pads each provided in at least a corresponding one of the recesses. Each of the tip portions of the contacts comes into contact with a corresponding one of the pads provided on the side walls of the recesses to give an elastic force to the corresponding pad provided on the side wall, so that the socket and the semiconductor package are electrically connected to each other.

Other aspects and advantages of the present invention will be apparent from the following description, the drawings and the claims.

DETAILED DESCRIPTION OF EXEMPLARY EMBODIMENTS

Hereinafter, exemplary embodiments of the present invention will be described with reference to the accompanying drawings. In all the drawings for the explanation of the embodiments, the members having the same functions are represented by the same reference numerals, and repeated description thereof will be omitted.
(Entire Configuration)

Figure 1:
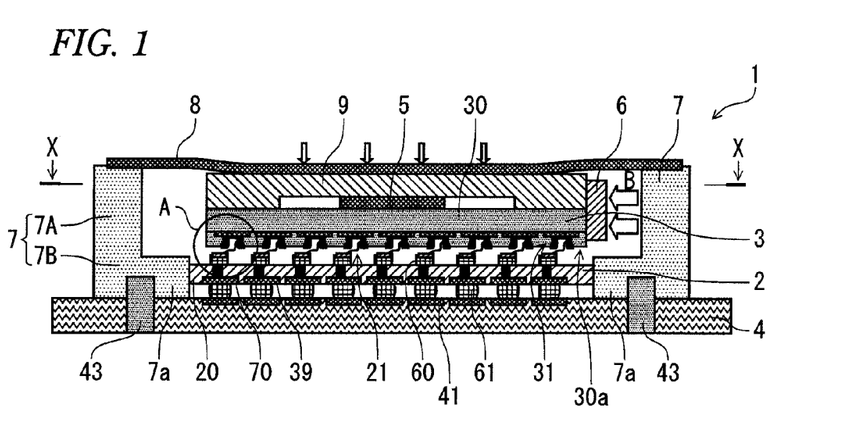
FIG. 1 is a schematic front sectional view of an example semiconductor device according to an embodiment of the present invention.
Figure 2:
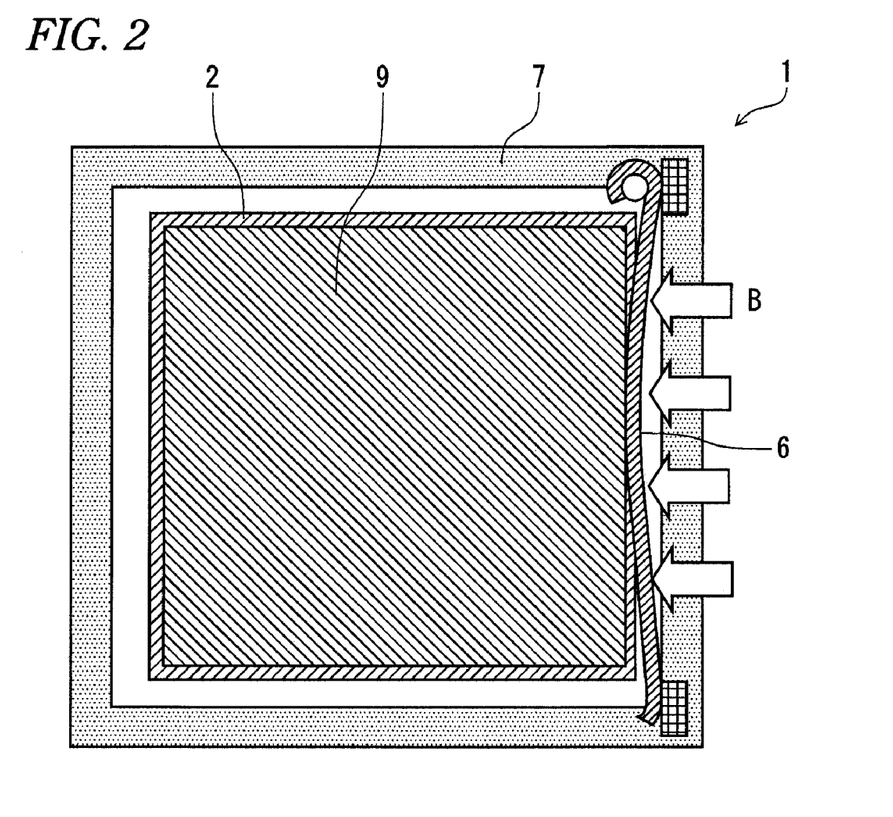
FIG. 2 is a schematic top sectional view of the example semiconductor device according to the embodiment of the invention.

The entire configuration of a semiconductor device according to an embodiment of the present invention will be hereinafter described with reference to FIGS. 1 and 2. FIG. 1 is a schematic front sectional view of an example semiconductor device 1 according to the embodiment of the invention. FIG. 2 is a sectional view taken along line X-X in FIG. 1.

The semiconductor device 1 according to the embodiment has a structure that a semiconductor package 3 is connected to a mounting circuit board 4 via a socket 2. The individual components will be described below in detail.
(Semiconductor Package)

In the semiconductor package 3, electronic components such as a semiconductor chip 5 are mounted on a printed circuit board 30. In the semiconductor package 3, one surface (the bottom surface in FIG. 1) of the printed circuit board 30 is formed with plural external connection pads 31. On the other hand, the semiconductor chip 5 is mounted on the other surface (the top surface in FIG. 1) of the printed circuit board 30 by a flip-chip connection method, for example. Although not shown in FIG. 1, the printed circuit board 30 has an internal wiring structure for connecting the semiconductor chip 5 to the pads 31.

The mounting area of the semiconductor chip 5 is not limited to the top surface of the printed circuit board 30, and its mounting method is not limited to the above-described one.

Figure 3:
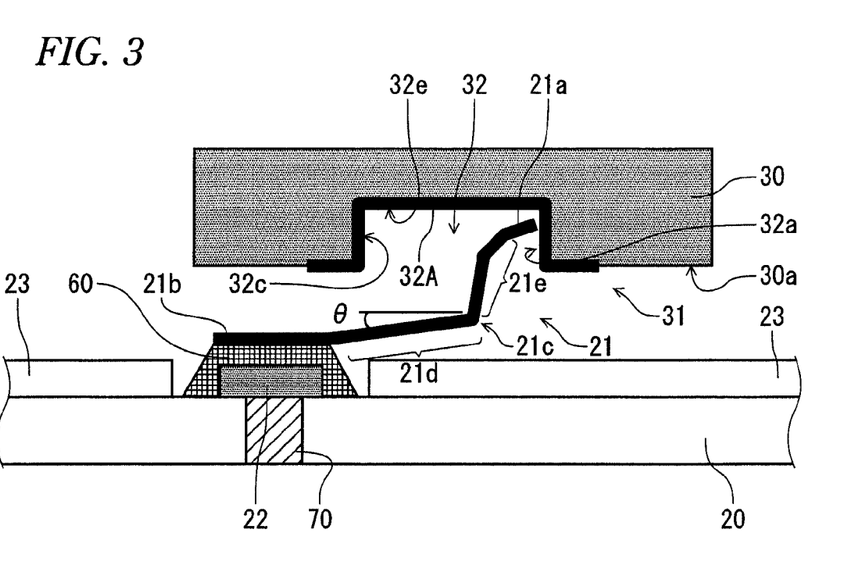
FIG. 3 is a schematic enlarged sectional view of part A of the semiconductor device shown in FIG. 1.
Figure 4:
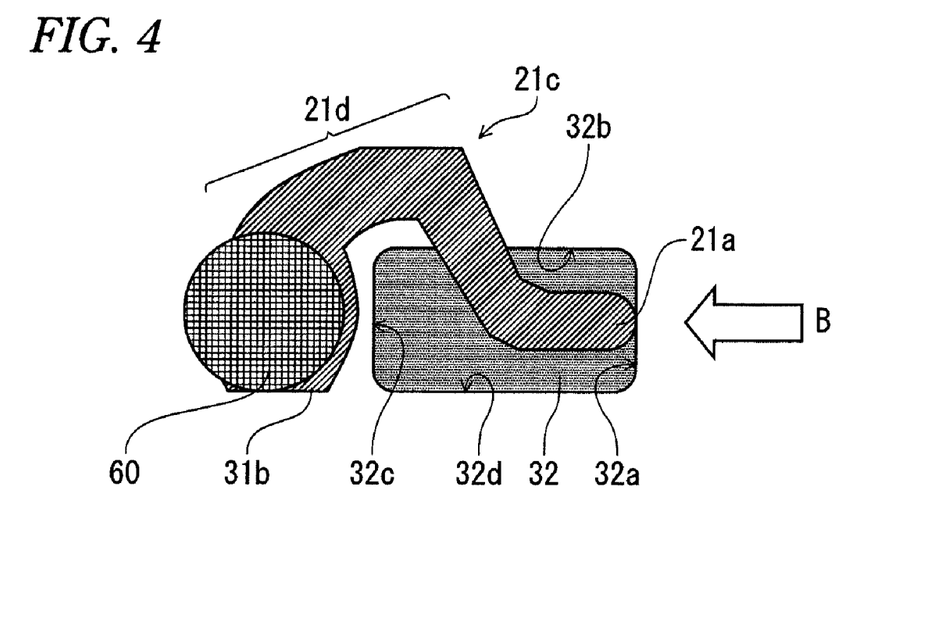
FIG. 4 is a schematic bottom view of a contact 21 shown in FIG. 3.

The pads 31 of the semiconductor package 3 are in pressure contact with and hence are electrically connected to respective contacts 21 of the socket 2 (described later). FIGS. 3 and 4 illustrate how the pads 31 are in contact with the respective contacts 21. FIG. 3 is a schematic enlarged sectional view of part A shown in FIG. 1, and FIG. 4 is a schematic bottom view of the contact 21 shown in FIG. 3.

As shown in FIGS. 1 and 3, each pad 31 has a groove-like recess 32 which is formed in a pad formation surface 30a (the bottom surface of the printed circuit board 30), and is composed of the recess 32 and a conductive coating 32A which is formed on inner side surfaces 32a-32d and a bottom surface 32e of the recess 32. According to the embodiment, each pad 31 comes into contact with the corresponding contact 21 when the inner side surface 32a of the recess 32 is brought into contact with a tip portion 21a of the contact 21 (described later in detail). An interconnection that leads from the conductive coating 32A formed in the recess 32 to the semiconductor chip 5 is not shown in FIG. 3.

As shown in FIGS. 3 and 4, the recess 32 is a groove that is generally shaped like a rectangular parallelepiped formed by the inner side surfaces 32a-32d and the bottom surface 32e. That is, for example, the recess 32 is a groove that extends straightly in the pressing direction (indicated by arrow B in FIG. 4) of a pressing member 6 (pressing means). In other words, the recess 32 is formed in a rectangular shape in a plan view, which is long in the pressing direction (indicated by arrow B in FIG. 4) of the pressing member 6. However, the shape of the recess 32 is not limited thereto.

The conductive coating 32A made of a conductive metal material is formed on the inner side surfaces 32a-32d and the bottom surface 32e of the recess 32. It suffices that the conductive coating 32A be at least formed on the inner side surface 32a of the recess 32.

For example, the conductive coating 32A is formed by electrolytic plating of copper (Cu), a first plating layer (nickel plating layer; not shown) is formed on the surface of the conductive coating 32A, and a second plating layer (gold plating layer; not shown) is formed on the first plating layer for reduction of contact resistivity and other purposes.

As shown in FIG. 3, the conductive coating 32A may be formed so as to extend to a portion, around the opening of the recess 32, of the pad formation surface 30a. In this case, the edges of those portions of the conductive coating 32A which are formed on the inner side surfaces 32a-32d of the recess 32 are not exposed, whereby those portions of the conductive coating 32A can be prevented from being peeled off. For the sake of simplification, that portion of the conductive coating 32A which is formed around the opening of the recess 32 of the pad 31 is not shown in FIG. 4.

As shown in FIG. 4, the inner side surface 32a of the recess 32 to contact the contact 21 is the surface that is perpendicular to the direction (indicated by arrow B in FIG. 4) in which the semiconductor package 3 is pressed by the pressing member 6. As a result, even if the tip portion 21a of the contact 21 is deviated in the direction that is perpendicular to the direction indicated by arrow B, it can come into contact with the inner side surface 32a reliably, whereby a contact failure can be avoided and the electrical characteristics can be improved.

Figure 7:
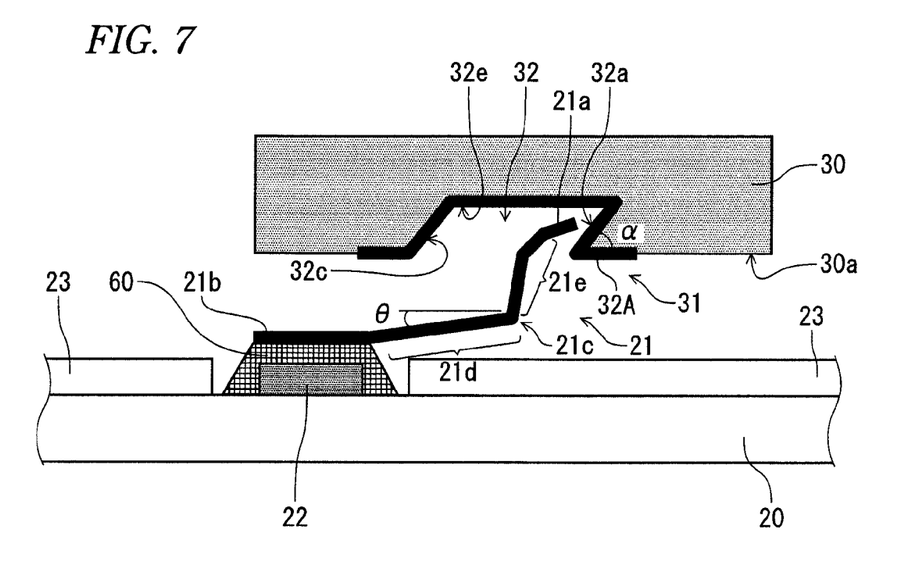
FIG. 7 is a schematic sectional view of another example pad of a semiconductor package of the semiconductor device according to the embodiment of the invention.

FIG. 7 shows another example of the pad 31. In the pad 31 shown in FIG. 3, the inner side surface 32a is perpendicular to the pad formation surface 30a. In contrast, in the pad 31 shown in FIG. 7, the inner side surface 32a of the recess 32 to contact the tip portion 21a of the contact 21 forms an angle α (<90°) with the pad formation surface 30a. This structure more reliably prevents the tip portion 21a of the contact 21 from coming out of the recess 32.

(Socket)

The socket 2 employs a circuit board (printed circuit board) 20 as a base member. One surface (the top surface in FIG. 1), to be connected to the semiconductor package 3, of the circuit board 20 is provided with the contacts 21 to be electrically connected to the respective pads 31 of the semiconductor package 31. As shown in FIG. 3, connection terminals 22 are formed on the circuit board 20 and the contacts 21 are joined to the respective connection terminals 22 with solder 60. Through vias 70 for connecting the connection terminals 22 to respective connection terminals 39 are formed in the circuit board 20. Reference numeral 23 denotes solder resist patterns.

The circuit board 20 may be a printed circuit board. The semiconductor device 1 can be made thinner than the related-art semiconductor device 101 which uses the resin housing 120. For example, the circuit board 20 may be made of a glass epoxy substrate, and the connection terminals 22, 39 and the through vias 70 might be formed by a subtractive method or a semi-additive method. Since no through-holes need to be formed through the circuit board 20 unlike in the case of the resin housing 120, the circuit board 20 is simple in structure and can be provided with the contacts 21 at a narrower pitch. Furthermore, interconnections can be formed inside the circuit board 20, and the connection terminals 39 which are formed in the other surface (the bottom surface in FIG. 1) to be connected to mounting circuit board 4 can be increased in the degree of freedom of arrangement.

Figure 5:
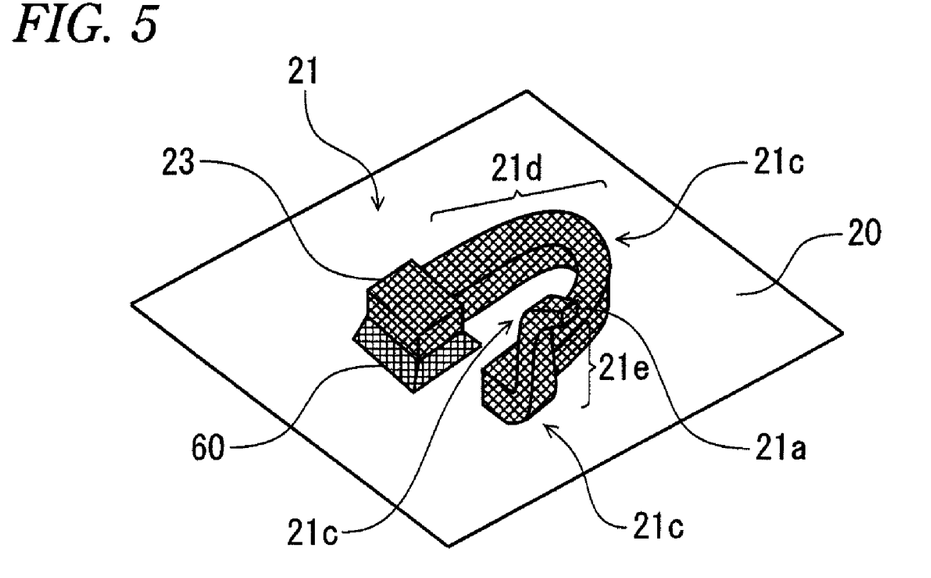
FIG. 5 is a schematic perspective view of an example of the contact 21 according to the embodiment of the invention.

Each contact 21 is made of a conductive, high-springiness metal material. Individual contacts 21 are formed by preparing a reel or a sheet of such a metal material and performing punching and bending on it. As shown in FIG. 5 (schematic perspective view) and FIGS. 3 and 4 referred to above, each contact 21 is a long and narrow metal piece and is bent three-dimensionally.

Taking conductivity, springiness, punching workability, bending workability, the price into consideration, phosphor bronze, beryllium copper, Corson alloy, and the like are typically suitable as the metal material of the contact 21. Although no particular limitations are imposed on the thickness of the contact 21, the thickness of the contact 21 is set so that the contact 21 can endure repetitive application of pressure in the elastically deformable range. For example, the thickness of the contact 21 is set at about 0.04 to 0.2 mm.

To prevent corrosion and increase the springiness of the contact 21, a first plating layer (nickel plating layer) on the surfaces of the contact 21 at a thickness of about 3 μm by immersing it in a nickel (Ni) plating bath. Furthermore, for reduction of contact resistivity and other purposes, a second plating layer (gold plating layer) is formed on the first plating layer at a thickness of about 0.2 μm by immersing it in a gold (Au) plating bath. From the viewpoint of cost reduction, the second plating layer may be formed on the surfaces of only the tip portion 21a.

Individual contacts 21 may be formed by preparing a wire, rather than a reel, of a metal material and performing cutting and bending on it.

A tail portion 21b of each contact 21 is fixed to the circuit board 20, and plural bent portions 21c exist between the tail portion 21b and the tip portion 21a. The plural bent portions 21c are bent so as to extend three-dimensionally (i.e., not two-dimensionally (not in a plane)), whereby each contact is a three-dimensional body (see FIG. 5).

Each contact 21 has an intermediate portion 21d that is provided between the tail portion 21d and the tip portion 21a and extends in a direction that is approximately parallel with the pad formation surface 30a. The expression "direction that is approximately parallel with the pad formation surface 30a" includes a direction that is parallel with the pad formation surface 30a and a direction that is inclined from the pad formation surface 30a by a very small angle θ, and thus covers a certain range of directions.

In the embodiment, as shown in FIGS. 4 and 5, the intermediate portion 21d is generally U-shaped.

More specifically, the one end portion (tail portion 21b) of each contact 21 is fixed to a connection terminal 22 of the circuit board 20 with solder 60. The intermediate portion 21d exists between the one end portion and the other end portion (tip portion 21a) so as to extend in a direction that is approximately parallel with the pad formation surface 30a (in the embodiment, it can be regarded as a direction that is approximately parallel with the connection terminal 22 formation surface of the circuit board 20). Each contact 21 also has a rise portion 21e whose bottom portion is connected to the tip-side end of the intermediate portion 21d and whose major part extends in a direction that is approximately perpendicular to the pad formation surface 30a (in the embodiment, it can be regarded as a direction that is approximately perpendicular to the connection terminal 22 formation surface of the circuit board 20). As described above, each of the intermediate portion 21d and the rise portion 21e has a bent portion 21c. For example, as shown in FIG. 5, the intermediate portion 21d first goes away from the one end portion (tail portion 21b) which is fixed to the circuit board 20, is then bent into a generally U-shape portion (bent portion 21c), and then extends (returns) so that the tip-side end comes close the one end portion (tail portion 21b). With this structure, the tail portion 21b, the tip-side end of the intermediate portion 21d, the bottom portion of the rise portion 21e, and a top portion (tip portion 21a) of the rise portion 21e are located, in a plan view, on a straight line that is parallel with the pressing direction (indicated by arrow B in FIG. 4) of the pressing member 6. The recess 32 also extends along the same straight line in the plan view. As shown in FIGS. 3-5, the tip portion 21a of each contact 21 extends parallel with the connection terminal 22 formation surface of the circuit board 20 (in the embodiment, parallel with the pad formation surface 30a of the printed circuit board 30).

Having the above structure, each contact 21 is sufficiently elastic with respect to force that is applied by the pressing member 6 in the pressing direction (indicated by arrow B in FIG. 4) and hence (the end face of) its tip portion 21a can reliably be brought into contact with the inner side surface 32a of the recess 32 of the corresponding pad 31.

Figure 6:
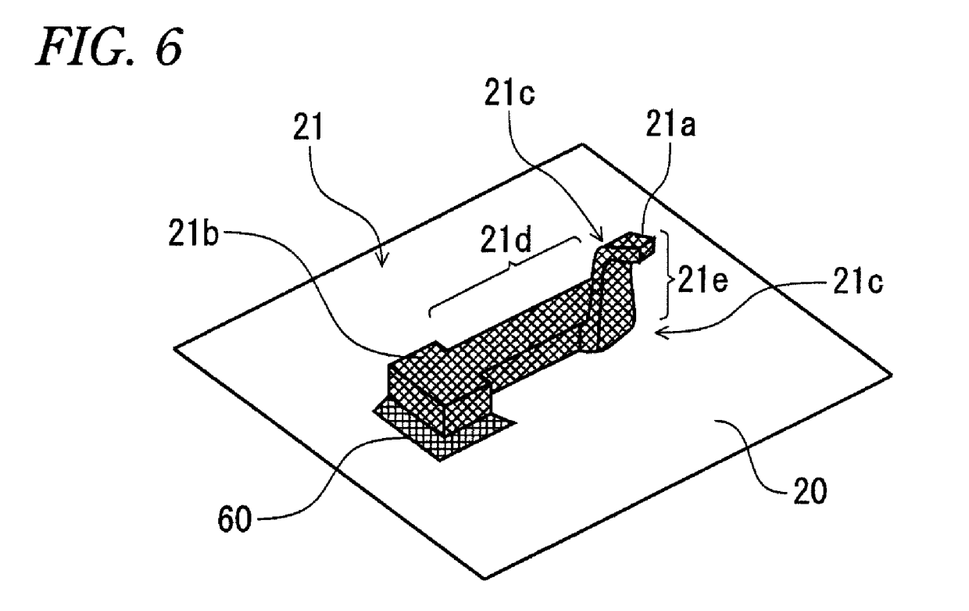
FIG. 6 is a schematic perspective view of another example of the contact 21 according to the embodiment of the invention.

FIG. 6 shows another example of each contact 21. As shown in FIG. 6, an intermediate portion 21d extends straightly away from the one end portion (tail portion 21b), fixed to the circuit board 20, of each contact 21.

The tip portion 21a of each contact 21 is tapered. In particular, in the embodiment, the end face of the tip portion 21a of each contact 21 is a curved surface or a spherical surface (see FIG. 4).

The contacts 21 are arranged and fixed to the circuit board 20. Naturally, the positions and the intervals of the contacts 21 are set so as to be suitable for the associated pads 31. Each contact 21 is oriented so that the end face of the tip portion 21a is directed to the upstream side of the pressing direction (indicated by arrow B in FIGS. 1, 2, and 4) of the pressing member 6.

For example, the contacts 21 are fixed (joined) to the circuit board 20 with solder 60. A conductive adhesive or the like may be used instead of solder.

Having the above structure, each contact 21 exhibits high springiness with respect to force that is applied by the pressing member 6 in the pressing direction (indicated by arrow B in FIGS. 1, 2, and 4). That is, when pressing force is applied by the pressing member 6, the end face of the tip portion 21a of each contact 21 is brought into contact with the pad 31 (the inner side surface 32a of the recess 32) and its intermediate portion 21d is elastically deformed in the pressing direction.

Unlike in the above-described semiconductor device 101 and the like in which the contacts exhibit high springiness in the direction that is perpendicular to the pad formation surface, in the semiconductor device 1 according to the embodiment no springiness generating regions are necessary in the contacts 21 in the direction that is perpendicular to the pad formation surface 30a and hence the height of the contacts 21 can be reduced. For example, whereas in the semiconductor device 101 a distance of about 3 mm needs to be secured between the top surface of the mounting circuit board 104 and the tip portions 121a of the contacts 121, in the semiconductor device 1 according to the embodiment the distance between the top surface of the mounting circuit board 4 and the tip portions 21a of the contacts 21 can be as short as about 1.2 mm. Therefore, the socket 2 and hence the entire device can be reduced in thickness to a large extent.

(Mounting Circuit Board)

As shown in FIG. 1, one surface (the top surface in FIG. 1) of the mounting circuit board 4 is formed with connection electrodes 41 to which the connection terminals 39 of the socket 2 are to be connected. For example, the socket 2 is fixed to the mounting circuit board 4 by joining the connection terminals 39 to the connection electrodes 41 with solder balls 61.

A frame body 7 whose outer circumferential portion is shaped like a rectangular picture frame is fixed to the mounting circuit board 4 by pins 43 (connection members) which are erected from the connection electrode 41 formation surface.

The frame body 7 is provided with the pressing member 6 for pressing the semiconductor package 3 in the direction that is parallel with the pad formation surface 30a. The pressing member 6 is an urging member, for example, and, in the embodiment, is a leaf spring made of a high-springiness metal material.

Furthermore, a positioning means 8 for positioning the semiconductor package 3 in the direction perpendicular to the pad formation surface 30a with respect to the socket 2 which is joined to the mounting circuit board 4 is provided on top of the frame body 7.

The positioning means 8 is made of a metal material, for example, and is shaped like a plate or a rod that can be attached to and detached from the outer circumferential portion of the frame body 7. It suffices that the positioning means 8 be able to prevent the semiconductor package 3 from deviating by more than a prescribed distance in the direction perpendicular to the pad formation surface 30a; the positioning means 8 may have either high springiness or no springiness.

In the embodiment, the positioning means 8 positions the semiconductor package 3 (and a heat spreader 9) with the heat spreader 9 connected to the top surface of the semiconductor package 3.

The frame body 7 has a movement restricting means 7a for restricting a movement of the socket 2 in the direction that is parallel with the pad formation surface 30a. As shown in FIG. 1, the frame body 7 is composed of a side wall portion 7A and a bottom portion 7B. The bottom portion 7B is formed with an opening portion having a shape (e.g., rectangular shape) that is similar to the external shape of the socket 2, and the opening portion serves as the movement restricting means 7a. That is, the socket 2 is fitted into and held by the opening portion (movement restricting means 7a), whereby a movement of the socket 2 in the direction that is parallel with the pad formation surface 30a is restricted. Therefore, when the semiconductor package 3 is pressed by the pressing means 6, the socket 2 is prevented from being deviated by the pressing force.

(Connection Structure)

The structure that joins the above-described constituent members will be described below.

For example, in the connection structure according to the embodiment, to connect the semiconductor package 3 to the mounting circuit board 4 via the socket 2, the socket 2 is joined to the mounting circuit board 4 in advance and the semiconductor package 3 is brought into pressure contact with, so to speak, a mounting circuit board with a socket.

As described above, the semiconductor package 3 is positioned by the positioning means 8 in the direction perpendicular to the connection terminal 22 formation surface of the circuit board 20 so that the tip portions 21a of the contacts 21 of the socket 2 go into the recesses 32 of the pads 31 of the semiconductor package 3.

In this state, the semiconductor package 3 is pressed by the pressing member (urging member) 6 in the direction that is parallel with the pad formation surface 30a, whereby the pads 31 (the inner side surfaces 32a of the recesses 32) of the semiconductor package 3 come into pressure contact with the tip portions 21a of the contacts 21 of the socket 2, respectively, in an elastic manner.

As a result, the semiconductor package 3 is electrically connected to the socket 2. That is, prescribed electric circuits are formed between the semiconductor chip 5 and the mounting circuit board 4.

As can be seen from the above description, unlike in the related-art semiconductor device 1 described above, in the semiconductor device 1 according to the embodiment no structure for pressing the semiconductor package 3 in the direction that is perpendicular to the pad formation surface 30a. Therefore, a reinforcement member such as a back plate can be omitted and the weight can be reduced accordingly. Furthermore, the printed circuit board 20 can be used as a base member of the socket 2 instead of a housing, whereby electrical contact between the semiconductor package 3 and the socket 2 can be made with a narrow pitch.

As another mode of use, the mounting circuit board with a socket which is formed by joining the socket 2 to the mounting circuit board 4 can be used for checking whether a semiconductor chip 5 or a semiconductor package 3 is defective or not. That is, the socket 2 is joined in advance to a test mounting circuit board (4) that is connected to a testing instrument and then a semiconductor chip 5 or a semiconductor package 3 is set with respect to the socket 2. Whether the semiconductor chip 5 or the semiconductor package 3 is defective or not can thus be determined.

As a further mode of use, the socket 2 can be used as an interposer by forming the contacts 21 on both surfaces of the socket 2 and each pair of contacts 21 that are symmetrical with each other are electrically connected to each other.

As described above, with the above-described socket, semiconductor package, and connection structure, a semiconductor device can be provided which can be reduced in thickness, weight, and terminal pitch, is simple in structure and easy to manufacture, can be improved in electrical characteristics, and can be implemented at a lower cost.

While the present invention has been shown and described with reference to certain exemplary embodiments thereof, other implementations are within the scope of the claims. It will be understood by those skilled in the art that various changes in form and details may be made therein without departing from the spirit and scope of the invention as defined by the appended claims.

What is claimed is:

1. A semiconductor device comprising
a socket comprising:
a circuit board;
a plurality of connection terminals disposed on the circuit board;
a plurality of contacts each fixed to a corresponding one of the connection terminals, wherein each of the contacts is formed of a conductive elastic member, each of the contacts comprising:
a tail portion fixed to the corresponding connection terminal;
an extending portion connected to the tail portion and extending in a direction substantially parallel with a surface of the circuit board;
a rise portion connected to the extending portion and extending in a direction substantially perpendicular to the surface of the circuit board; and
a tip portion connected to the rise portion,
a semiconductor package electrically connected to the socket, comprising:
a plurality of recesses each comprising a bottom surface and a side wall; and
a plurality of pads each provided in at least a corresponding one of the recesses, wherein
each of the tip portions of the contacts comes into contact with a corresponding one of the pads provided on the side walls of the recesses to give an elastic force to the corresponding pad provided on the side wall, so that the socket and the semiconductor package are electrically connected to each other.

2. The semiconductor device of claim 1, wherein each of the contacts is fixed to a corresponding one of connection terminals via a solder or a conductive adhesive.

3. The semiconductor device of claim 1, further comprising:
a housing which houses the socket and the semiconductor package therein; and
a lid disposed over the semiconductor package so as to give a force to the semiconductor package and the socket in a direction substantially perpendicular to the surface of the circuit board.

4. The semiconductor device of claim 3, further comprising:
an urging member disposed in the housing to move the semiconductor package in the direction substantially parallel with the surface of the circuit board, such that each of the tip portions of the contacts gives the elastic force to the corresponding pad provided on the side wall.

* * * * *